United States Patent [19]
Le et al.

[11] Patent Number: 6,081,455
[45] Date of Patent: Jun. 27, 2000

[54] EEPROM DECODER BLOCK HAVING A P-WELL COUPLED TO A CHARGE PUMP FOR CHARGING THE P-WELL AND METHOD OF PROGRAMMING WITH THE EEPROM DECODER BLOCK

[75] Inventors: Binh Q. Le, Mountain View; Pau-ling Chen, Saratoga; Shane C. Hollmer, San Jose, all of Calif.

[73] Assignee: Advanced Micro Devices, Inc., Sunnyvale, Calif.

[21] Appl. No.: 09/232,023

[22] Filed: Jan. 14, 1999

[51] Int. Cl.[7] ..................................... G11C 16/00
[52] U.S. Cl. ................................. 365/185.23; 365/230.06
[58] Field of Search .................... 365/230.06, 185.23, 365/185.25, 185.27, 185.28, 185.18

[56] References Cited

U.S. PATENT DOCUMENTS

| | | | |
|---|---|---|---|
| 5,365,479 | 11/1994 | Hoang et al. | 365/185.23 |
| 5,438,542 | 8/1995 | Atsumi et al. | 365/185.23 |
| 5,654,925 | 8/1997 | Koh et al. | 365/185.23 |
| 5,680,349 | 10/1997 | Atsumi et al. | 365/185.23 |
| 5,844,840 | 12/1998 | Le et al. | 365/185.23 |

*Primary Examiner*—Tan T. Nguyen
*Attorney, Agent, or Firm*—Skjerven, Morrill, MacPherson, Franklin & Friel LLP; Edward C. Kwok

[57] ABSTRACT

A block decoder includes a p-well. A low voltage source is coupled to the p-well for asserting a body bias voltage to the p-well. An n-type word line pass transistor is positioned within the p-well and is coupled to a word line for passing programming voltages to the word line. A high voltage source is coupled to pass circuitry configured to assert a voltage on a gate of the pass transistor. The low voltage source is configured to apply a voltage of approximately 10 volts or more to the p-well during programming, thus reducing the voltage between the source and body region (and thus the threshold voltage as well) of NMOS transistors disposed within the p-well. Therefore, the amount of voltage needed to be applied to the pass transistors is reduced. Furthermore, the pass circuitry can work for lower supply voltages since the supply voltage is limited by the threshold voltage of the n-type transistors within the p-well.

11 Claims, 4 Drawing Sheets

EEPROM DECODER BLOCK HAVING A P-WELL COUPLED TO A CHARGE PUMP FOR CHARGING THE P-WELL AND METHOD OF PROGRAMMING WITH THE EEPROM DECODER BLOCK

CROSS-REFERENCE TO RELATED APPLICATION

This application related to commonly owned co-pending U.S. application Ser. No. 08/914,543 filed Aug. 19, 1997 which is incorporated herein by reference in its entirety.

FIELD OF THE INVENTION

The present invention relates to EEPROM technology. More specifically, it relates to an EEPROM decoder block having a p-well coupled to a charge pump for charging the p-well and a method of programming with the EEPROM decoder block.

BACKGROUND OF THE INVENTION

In EEPROM arrays, high voltages are generated on chip for programming purposes. These high voltages (e.g., 20 volts) are much higher than the highest operating voltage (e.g., 3 volts), and are typically produced by charge pumps. Because these charge pumps consume power and circuit area, it is desirable to minimize the total capacitance that these high voltage generators drive.

In CMOS integrated circuits, PMOS transistors are used in pull up circuits while NMOS transistors are used in pull down circuits. However, PMOS transistors in a CMOS integrated circuit must be electrically isolated in an N-well. This N-well must be biased at or above the high supply voltage to guarantee that the P/N junction, formed by the P-type drain/source regions of the PMOS transistors and the N-well, are not forward-biased. If PMOS transistors are used in the high-voltage subcircuits, these N-type isolation wells constitute a very large capacitance for the on-chip high voltage generator to drive. Moreover, the N-type isolation well itself increases area and adds process complexity.

Since NMOS transistors can be fabricated on a P-type substrate, such NMOS transistors require no isolation well. Therefore, in high-voltage subcircuits supplied by on-chip high-voltage generators, the use of NMOS transistors is typically preferable to the use of PMOS transistors.

However, the lowest conducting source-drain voltage of an NMOS transistor is limited by the transistor's threshold voltage ("Vt"). Thus, if a high voltage needs to pass from the drain to source, then the gate voltage must be at least one Vt higher than the drain voltage.

A conventional circuit 100 which is used to pass a high voltage Vpp is illustrated in FIG. 1. The circuits of the kind illustrated in FIG. 1 are important in NAND flash memory applications, especially for decoding circuits such as block and row decoders and high-voltage multiplexers.

The circuit in FIG. 1 has drawbacks. The first drawback is that the circuit performance is degraded as the supply voltage Vcc decreases. Moreover, the circuit is inoperative when the supply voltage Vcc is less than the sum of the threshold voltages VtM2 and VtM3 of transistors M2 and M3, respectively. In order to pass Vpp to word line WL, node B (attached to the gate of M3) must be boosted to Vpp+VtM3. In order for node B to be boosted to Vpp+VtM3, node A must be boosted to Vpp+VtM3+VtM2. With supply voltages Vcc around 3V, and threshold voltages above 1.5 volts due to the body effect, the circuit in FIG. 1 does not function properly.

In order to boost node A to Vpp+VtM3+VtM2, the following inequality of Equation (1) must hold in which CA is the total parasitic capacitance of node A, and C is the capacitance of capacitor C.

$$Vcc*C/(C+CA) \geq VtM2+VtM3 \qquad (1)$$

In order for the circuit in FIG. 1 to function with low supply voltages Vcc less than or equal to 3V, transistors M2 and M3 must have very low threshold voltages VtM2 and VtM3. However, the various manners of lowering the threshold voltage of a transistor all result in larger leakage currents from source to drain when the transistor is off.

Another way to satisfy the above inequality is to increase the coupling ratio C/(C+CA) by increasing the coupling capacitor C. However, capacitors are fairly large circuit elements and increasing C increases circuit area.

Typically, the high voltage pass gate M3 of FIG. 1 is used to drive word lines of a memory array during a high-voltage operation such as programming. The memory array may have many thousands of word lines. Often only one word line is programmed while all the other word lines are not programmed. In this case, only one of the word lines in the selected block is raised to Vpp while the other fifteen word lines in the selected block are raised to approximately ten volts; more importantly, the word lines in all of the unselected blocks are left floating. If transistor M3 is made to be a low threshold device and is replicated once for each word line, the sum of the leakage currents in all of the words in the unselected blocks will be very high, thus placing high current demands on the high voltage charge pump, wasting a large amount of power, and slowing the rise time of the charge pump voltage.

As is apparent from the above discussion, a need exists for a block decoder having small circuit area, low leakage current, fast control of high voltage pass transistors, and low supply voltage capability.

SUMMARY OF THE INVENTION

In accordance with the present invention, a block decoder includes a p-well. A low voltage source is coupled to the p-well for asserting a positive voltage to the p-well of, for example, up to the voltage of the unselected word lines in the selected block (i.e., $V_{unselect}$). An n-type word line pass transistor for each word line in the block is positioned within the p-well and passes programming voltages to the word line. A high voltage source is coupled to pass circuitry configured to assert a voltage on a gate of the pass transistor. A separate p-well may correspond to each block.

The low voltage source is configured to apply a voltage of, for example, $V_{unselect}$ or less to the p-well during programming, thus reducing the voltage between the source and body region (and thus the threshold voltage as well) of NMOS transistors disposed within the p-well. Therefore, the pass circuitry can work for lower supply voltages since the supply voltage is limited by the threshold voltage of the n-type transistors within the p-well. Furthermore, the amount of voltage needed to be applied to the pass transistors is reduced.

DESCRIPTION OF THE INVENTION

Figure 1:
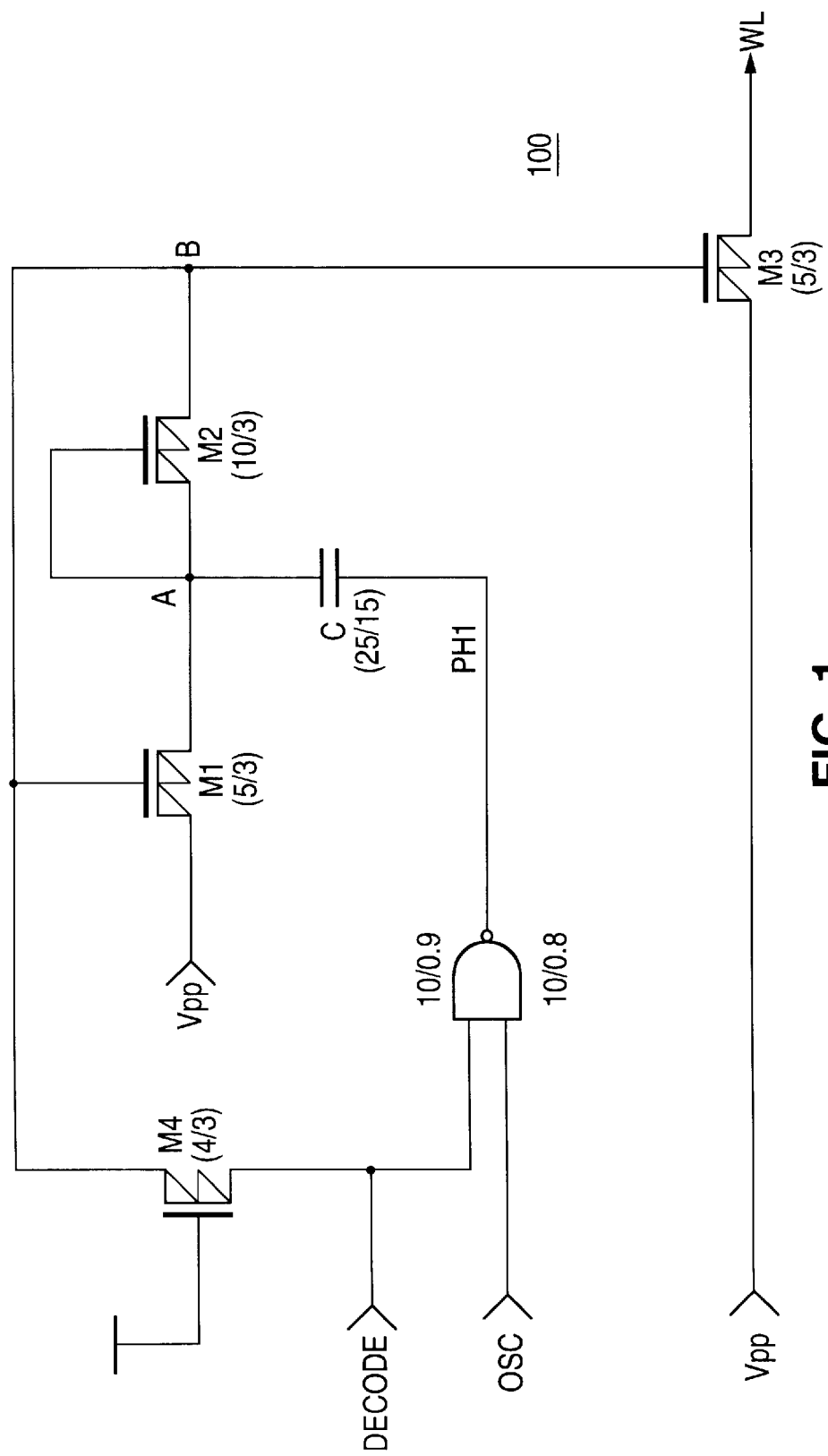
FIG. 1 is a circuit diagram of a conventional pass circuit.
Figure 2:
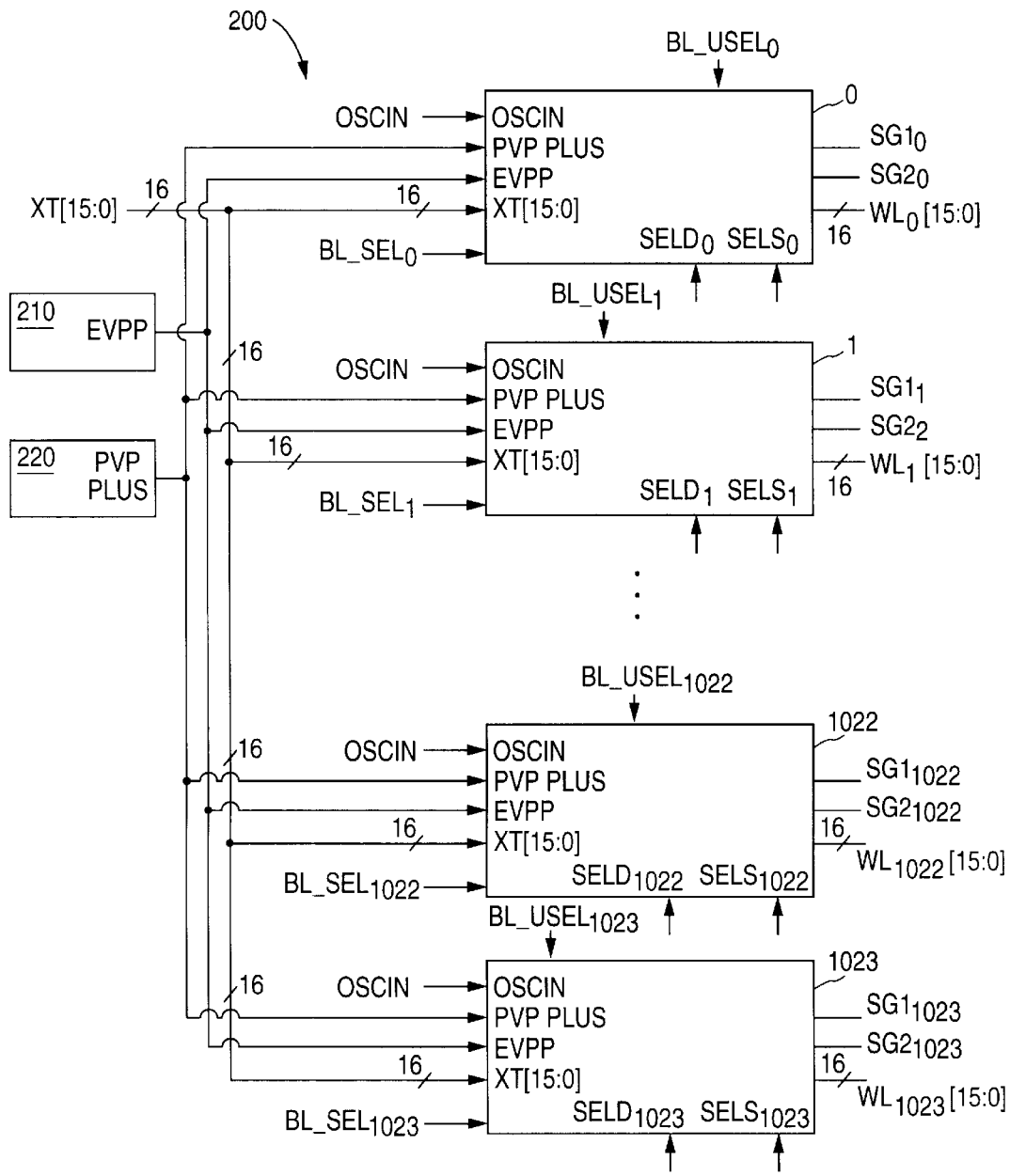
FIG. 2 is a schematic diagram of an EEPROM array including block decoders.

FIG. 2 is a schematic diagram of an EEPROM 200 which includes 1024 block decoders 0 to 1023, of which, for clarity reasons, only block decoders 0, 1, 1022 and 1023 are shown. Each block decoder M (where M=0 to 1023) receives a decode signal BL_SEL$_M$ which is set (e.g., has a voltage approximately equal to the supply voltage Vcc) if the block decoder M is selected for programming. Otherwise, signal BL_SEL$_M$ is not set (e.g., grounded) Each block decoder M, when selected for programming (BL_SEL$_M$=Vcc), passes signals XT[15:0] to respective word lines WL$_M$[15:0]. When block decoder M is not selected for programming (BL_SEL$_M$=ground), word lines WL$_M$[15:0] float. Block decoders M also receive a clock signal OSCIN, an unselect signal BL_USEL$_M$, two select gate signals SG1$_M$ and SG2$_M$, a low pump voltage EVPP from a low voltage pump 210 (e.g., 10 volts), and a high pump voltage PVPPLUS from a high voltage pump 220 (e.g., 22.5 volts). During pump up, high pump voltage PVPPLUS increases from approximately Vcc to approximately 22.5 volts, for example, while low pump voltage EVPP increases from approximately Vcc to approximately 10 volts.

Figure 3:
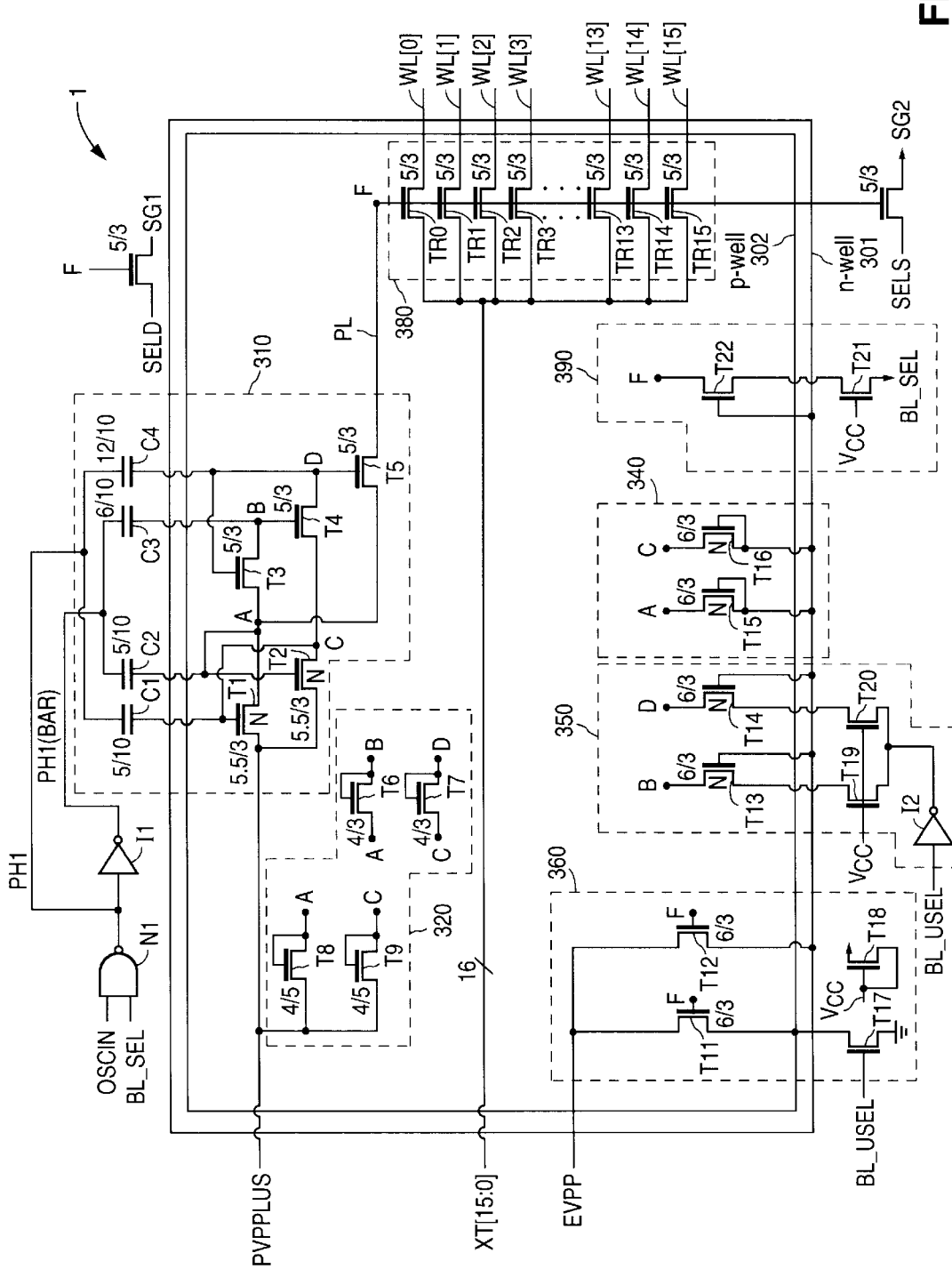
FIG. 3 is a circuit diagram of a block decoder of FIG. 2.

FIG. 3 shows block decoder 1 which is structured the same as block decoders 2 to 1024. When selected for programming, block decoder 1 passes voltages XT[0] to XT[15] to word lines WL$_1$[0] to WL$_1$[15] through NMOS pass transistors TR0 to TR15, respectively. One of voltages XT[0] to XT[15] (e.g., voltage XT[3]) corresponds to a relatively high programming voltage Vpp of, for example, 20 volts. The remaining voltages XT[0] to XT[2] and XT[4] to XT[15] have a relatively low voltage Vqq of, for example, 10 volts. The gate of each pass transistor TR[0] to TR[15] is coupled to pass line PL (node F).

Block decoder 1 has at least three advantages. First, all of the transistors are NMOS transistors. Since PMOS transistors are larger than NMOS transistors the use of exclusively NMOS transistors allows for a smaller block decoder 1. Furthermore, the p-well does not need to charged to the programming voltage Vpp, but may be charged to a voltage of, for example, only Vqq or less. Thus, the programming speed is increased and the power requirement will be less.

Second, each transistor T1 to T16 and TR0 to TR15 has a threshold voltage Vt according to Equation (2).

$$Vt = V_{t\phi} + \alpha((2\psi_B + V_{SB})^{1/2} - (2\psi_B)^{1/2}) \qquad (2)$$

where:
Vt=threshold voltage,
$V_{t\phi}$=threshold voltage when the body and source are at equal voltages,
$V_{SB}$=voltage between source and body, and $\alpha$ and $\psi_B$ are constants.

Thus, the threshold voltage Vt decreases as the voltage between the source and body $V_{SB}$ decreases. All of the NMOS transistors T1 to T16 and TR0 to TR15 are situated in a common p-well 302 which may be charged to a voltage of, for example, V$_{unselect}$. By so charging p-well 302, the voltage $V_{SB}$ between the source and body of transistors T1 to T16 and TR0 to TR15 is reduced resulting a corresponding reduction in threshold voltage Vt.

Since the threshold voltage Vt of programming voltage pass transistor TR3 is reduced compared to a grounded p-well 302, the high pump voltage PVPPLUS required to completely open pass transistor TR3 is reduced.

Third, by placing the NMOS transistors in a charged p-well to reduce threshold voltages, the pass circuitry comprised of the NMOS transistors can work at lower supply voltages. Signal OSCIN drives alternating clock signals PHI and PHI (bar) which vary from ground to the supply voltage Vcc. Due to capacitive coupling through capacitors C1 and C4 with signal PHI, the voltage at the gate of transistors T1, T3 and T5 increases proportional to Vcc when signal PHI has a rising edge. Similarly, due to capacitive coupling through capacitors C2 and C3, the voltage at the gate of transistors T2 and T4 increases proportional to Vcc when signal PHI(bar) has a rising edge. Since, the threshold voltage of transistors T1 to T5 in the pass circuitry is lowered due to the charged p-well, the level of the supply voltage Vcc required to boost the gate voltage of transistors T1 to T5 at the appropriate times decreases. Therefore, the pass circuitry 310 can pass high voltage PVPPLUS using a lower supply voltage Vcc. Other advantages are described herein.

Block decoder 1 (FIG. 3) includes a p-well 302 which is a body region for transistors T1 to T16, T22, and TR0 to TR15. Transistors T1, T2, T13–T16 are low threshold voltage transistors having a threshold voltage Vt of approximately 0.2 volts if the source body voltage $V_{SB}$ is zero. The other transistors T3 to T12 and TR0 to TR15 in p-well 302 have a threshold voltage of approximately 0.6 volts if $V_{SB}$ is zero. Of course, as $V_{SB}$ increases, the threshold voltage Vt increases until, when $V_{SB}$ is 20 volts, the threshold voltage Vt of transistors T1, T2 and T13 to T16 increases to approximately 1.3 volts and the threshold voltage of transistors T3 to T12 and TR0 to TR15 have a threshold voltage of approximately 1.7 volts. However, due to the charging of p-well to 10 volts during operation, the actual operating threshold voltage is approximately 0.7 volts for transistors T1, T2 and T13 to T16 and 1.3 volts for transistors T3 to T12 and TR0 to TR15.

The detailed structure of block decoder 1 is now described with reference to FIG. 3. The pass circuitry of the block decoder 1 includes portions 310, 320, 340, 350, 360, 380 and 390.

Portion 310 includes five transistors T1 to T5 and four capacitors C1 to C4. The upper terminals of capacitors C1 and C4 carries signal PHI while the upper terminals of capacitors C2 and C3 carries signal PHI(bar). The lower terminal of capacitor C1 is coupled to node C including the gate terminal of transistor T1, the right terminal of transistor T2, and the left terminal of transistor T4. The lower terminal of capacitor C2 is coupled to node A including the right terminal of transistor T1, the gate terminal of transistor T2, the left terminal of transistor T3, and the left terminal of transistor T5. The lower terminal of capacitor C3 is coupled to node B including the right terminal of transistor T3 and the gate terminal of transistor T4. The lower terminal of capacitor C4 is coupled to node D including the gate terminals of transistors T3 and T5 and the right terminal of transistor T4. The left terminals of transistors T1 and T2 have voltage PVPPLUS and the right terminal of transistor T5 is coupled to node F.

Block decoder 1 has two operating modes, the unselected mode and the selected mode. When in the unselected mode, signal BL_SEL is grounded and signal BL_USEL is at Vcc.

The n-well 301 is at Vcc minus the threshold voltage Vt18 of transistor T18 due to portion 370 of the pass circuitry. Thus, the gate of transistor T22 is also at Vcc-Vt18. Referring to portion 390, the lower terminal of transistor T22 (currently the source) is at ground since transistor T21 couples the lower terminal to signal BL_SEL. Thus, transistor T22 is on coupling node F to ground. Node F is grounded in the unselected mode so that pass transistors TR0 to TR15 are turned off.

Regarding nodes B and D, Since the signal BL_USEL is at Vcc, the lower terminals of transistors T13 and T14 of portion 350 are at ground. Since the gate terminals of transistors T13 and T14 are coupled to the n-well 301 at a voltage of Vcc-Vt18, transistors T13 and T14 are on coupling nodes B and D to ground. Also, since BL_SEL is ground, signals PHI and PHI(bar) are not oscillating.

Voltage PVPPLUS may be as high as, for example, 22.5 volts. Thus, the voltage at the gate terminals of transistors T1 and T2 (nodes A and C, respectively) should be relatively high to avoid oxide breakdown. Also, nodes A and C should be higher than ground to reduce the drain-source voltage Vds of transistors T1 and T2, thereby avoiding punch-through.

The voltages at nodes A and C are set at higher than ground by portion 340 of the pass circuitry. Nodes A and C are pulled up to one threshold voltage Vt15 or Vt16 less than the voltage of the n-well 301 through respective transistors T15 and T16. Alternatively, the lower terminal of transistors T15 and T16 may be connected to a higher voltage source of, for example, 5 to 7 volts, thereby pulling the voltage of nodes A and C up to one threshold voltage Vt15 or Vt16 less than the higher voltage.

If block decoder 1 is selected, BL_SEL is Vcc while BL_USEL is ground The purpose of selecting block decoder 1 is to pass the voltage PVPPLUS to node F (coupled to the gate terminals of pass transistors TR0 to TR15) as the voltage PVPPLUS increases. The maximum value of high voltage PVPPLUS is high enough to turns pass transistors TR0 to TR15 on to pass the high programming voltage of, for example, 20 volts to the selected word line. Likewise a lower voltage of, for example, 10 volts is passed to the unselected word lines.

Before clock signal OSCIN begins oscillating, the voltages at nodes A, B, C, and D are initialized. The initialization voltages for nodes A and C are the same as the voltages of nodes A and C in the unselected case.

Nodes B and D are initialized as follows. Since BL_USEL is low, the lower terminals of transistors T19 and T20 are at Vcc. Thus, the lower terminals of transistors T13 and T14 are at Vcc-Vt19 and Vcc-Vt20, respectively. Since the gate terminal of transistors T13 and T14 is at Vcc-Vt18, the voltage at nodes B and D are pulled up to Vcc-Vt18-Vt13 and Vcc-Vt18-Vt14, respectively. Node F is also pulled up to Vcc-Vt21-Vt22 through transistors T21 and T22. After initialization is complete, transistors T13, T14, T15, T16, T21 and T22 are turned off as the voltage at nodes A, B, C, D and F rise.

Since BL_SEL is at Vcc, clock signals PHI and PHI(bar) oscillate. As signal PHI transitions from ground to Vcc, transistors T1, T3, T5 are turned on. Therefore, node F gets voltage PVPPLUS while PHI is at Vcc. As signal PHI transitions from Vcc to ground and signal PHI (bar) transitions from ground to Vcc, nodes A and B are coupled up from the previous voltage value of PVPPLUS which is steadily rising. The jump in voltage at nodes A and B is higher than even the current PVPPLUS thus turning transistors T2 and T4 on and coupling nodes C and D to the higher voltage PVPPLUS. The voltage at nodes C and D needs to be higher so that the gates of T1, T3 and T5 are at a high enough voltage at the next rising edge of PHI that transistors T1, T3 and T5 are turned on thus starting a new cycle. At this time, nodes A, B and F get the most updated voltage from PVPPLUS. This process is repeated such that node F always has the updated voltage PVPPLUS with some delay. Finally, node F will be at 22.5 volts.

Figure 4:
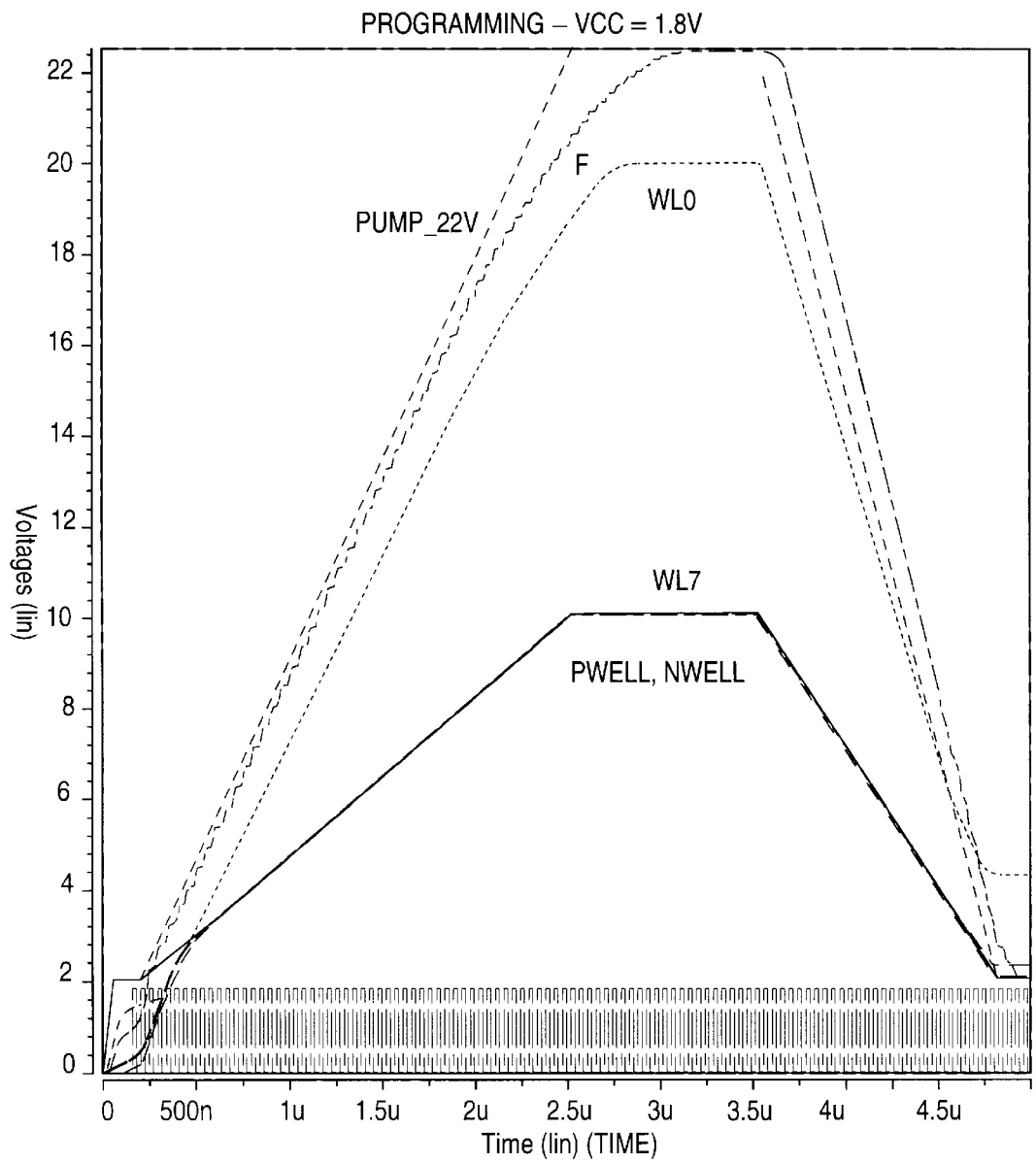
FIG. 4 is a simulated signal test result diagram showing test data obtained by simulating the circuit of FIG. 3.

Simulated signal test results are shown in FIG. 4 which show that the pass line PL voltage at node F transitions from ground to over 22 volts in less than 3 µs (microseconds) using a supply voltage Vcc of only 1.8 volts.

Circuit 320 includes transistors T6 to T9 where transistors T8 and T9 have right terminals connected to PVPPLUS and right terminals and gate terminals connected to nodes A and C, respectively. Transistors T6 and T7 have left terminals connected to nodes A and C and right terminals and gate terminals connected to nodes B and D, respectively. The purpose of circuit 320 is to discharge nodes A, B, C and D when PVPPLUS goes down from, for example, 22.5 volts to Vcc-Vt.

Well charge circuit 360 includes transistors T11 and T12 having an upper terminal voltage of EVPP and having gate terminals coupled to node F. The lower terminals of transistors T11 and T12 are respectively coupled to p-well 302 and n-well 301.

In the unselected case, n-well 301 should have a positive voltage relative to p-well 302. Since transistors T11 and T12 are off (node f is grounded), n-well 301 is coupled through transistor T18 to Vcc-Vt18. P-well 302 is grounded through transistor T17 because the signal BL_USEL is at Vcc. Thus, reverse biasing between p-well 302 and n-well 301 is ensured thereby avoiding latch-up.

In the selected case, the voltage of p-well 302 should be raised to $V_{unselect}$ (e.g., about 10 volts). To avoid forward bias, the voltage of n-well 301 should be at least the same as p-well 302. Since node F will finally increase to 22.5 volts, transistors T11 and T12 will be turned on hard coupling p-well 302 and n-well 301 to EVPP.

Although the above describes an EEPROM 100 in which n-well 301 is biased to 10 volts, n-well 301 may also be biased to less than 10 volts. However, if the voltage of n-well 301 is reduced, the power requirement are also reduced. However, due increased body effect, the threshold voltage of the transistors in p-well 302 will increase, thereby increasing the supply voltage requirement.

Although the principles of the present invention have been described with reference to specific embodiments, these embodiments are illustrative only, not limiting. Many other embodiments of the principles of the present invention will be apparent in light of this disclosure and the following claims.

We claim:

1. A block decoder comprising:
   a p-well;
   a low voltage source coupled to said p-well and configured to assert a low voltage on said p-well;
   an n-type word line pass transistor positioned with said p-well and coupled to a word line for passing programming voltages to said word line;
   a high voltage source; and
   pass circuitry disposed in said p-well, said pass circuitry coupled to said high voltage source, said pass circuitry configured to assert a voltage on a gate of said pass transistor.

2. The memory array of claim 1, wherein said n-type word line pass transistor is an NMOS transistor.

3. The memory array of claim 1, wherein said low voltage is 10 volts or higher.

4. The memory array of claim 1, wherein said low voltage is 1 volt or higher.

5. The method array of claim 1, wherein said programming voltage is approximately 20 volts.

6. The memory array of claim 1 further comprising a plurality of NMOS word line pass transistor disposed within said p-well and coupled to corresponding word lines.

7. The memory array of claim 1, wherein said local pump comprises a plurality of NMOS transistors.

8. A method of passing a programming voltage to a word line comprising the step of asserting a positive voltage on a p-well which contains an NMOS word line pass transistor configured to pass the programming voltage to the word line.

9. The method of claim 8, further comprising providing said NMOS word line pass transistor in said p-well before asserting a positive voltage.

10. The method of claim 8, wherein asserting the positive voltage comprises asserting a voltage of at least 10 volts on said p-well.

11. The method of claim 8, wherein asserting the positive voltage comprises asserting a voltage of at least 1 volt on said p-well.

\* \* \* \* \*